(12) United States Patent
Wu et al.

(10) Patent No.: US 6,703,855 B1
(45) Date of Patent: Mar. 9, 2004

(54) STRUCTURE OF A PROBE

(75) Inventors: Kun-Jung Wu, Panchiao (TW); Chia-Cheng Wang, Jughe (TW)

(73) Assignee: C.C.P. Contact Probes Co., Ltd. (TW)

( * ) Notice: Subject to any disclaimer, the term of this patent is extended or adjusted under 35 U.S.C. 154(b) by 0 days.

(21) Appl. No.: 10/308,074

(22) Filed: Dec. 3, 2002

(51) Int. Cl.[7] ............................................. G01R 31/02
(52) U.S. Cl. ..................... 324/761; 324/754; 324/158.1
(58) Field of Search ................................. 324/761, 758, 324/754, 158.1, 765, 72.5; 439/482, 700, 824, 73

(56) References Cited

U.S. PATENT DOCUMENTS

| | | | |
|---|---|---|---|
| 4,716,365 A | * 12/1987 | Pool | 324/761 |
| 4,806,856 A | * 2/1989 | Hvezda et al. | 324/761 |
| 5,283,518 A | * 2/1994 | King et al. | 324/761 |
| 5,518,410 A | * 5/1996 | Masami | 439/71 |
| 6,285,205 B1 | * 9/2001 | Creeden | 324/761 |
| 6,498,506 B1 | * 12/2002 | Beckous | 324/761 |

* cited by examiner

Primary Examiner—Kamand Cuneo
Assistant Examiner—Jimmy Nguyen
(74) Attorney, Agent, or Firm—Birch, Stewart, Kolasch & Birch, LLP

(57) ABSTRACT

A structure of a probe is disclosed. The structure of the probe comprises a tube which comprises a larger end and a smaller end with a through hole disposed therewith, an axle having a supporting portion is positioned on the larger end of the tube, wherein the supporting portion comprises a fitting aperture, a pointed element fixed into the fitting aperture of the axle passes through the through hole of the tube, a positioning element positioned at a predetermined portion of the pointed element, a resilient element positioned around the axle, and a positioning cap comprising a through channel for fitting onto the axle and pressing against a juncture of the tube, wherein a smaller end of the positioning cap is formed as a positioning portion for positioning the resilient element. The pointed element is elastically slidable within the tube is used for probing.

5 Claims, 4 Drawing Sheets

STRUCTURE OF A PROBE

FIELD OF THE INVENTION

The present invention relates to a structure of a probe, and more particularly to a structure of a pointed element that is can move elastically within a tube by a resilient element.

BACKGROUND OF THE INVENTION

The probes available in the market are generally for testing various finished electronic elements and circuit boards. Typically a probe that is connected to for example, a computer, is brought in contact with the testing points of the electronic elements and the circuit boards, and the test signal is transmitted through a wire back to computer for testing to check for any defect in the electronic elements or circuit boards. Thus, the test equipment needs to be more precise.

Referring to FIG. 1, shows a conventional structure of a probe, which comprises a first tube A having a second tube B therewithin. The second tube B comprises a third tube C which is capable of sliding through the second tube B. A pointed element D penetrates through the first tube A, the second tube B and presses against the third tube C. The second tube B comprises a resilient element E therewithin, wherein a distal end of the second tube B is welded onto an axle F, thus the resilient element E is positioned between the axle F and the third tube C. Further, a positioning element G is set at a proper position of an exposed portion of the pointed element D to limit the compression of the pointed element D for probing operation.

However, the conventional structure of probe is very complicated and causes inconvenience during assembly operations, such as fixing, tightening, and welding operations. Accordingly, the manufacturing cost is high, and therefore has no economic advantage.

SUMMARY OF THE INVENTION

Accordingly, it is an object of the present invention to provide a new structure of a probe in order to resolve the defects of the aforementioned prior art.

It is another object of the present invention to provide a structure of a probe, which capable of moving elastically within a tube by a resilient element.

In accordance with the above objects and other advantages as broadly described herein, the present invention provides a structure of a probe comprising a tube which comprises a larger end and a smaller end with a through hole disposed therewith, an axle having a supporting portion is positioned on the larger end of the tube, wherein the supporting portion comprises a fitting aperture, a pointed element fixed into the fitting aperture of the axle passes through the through hole of the tube, a positioning element positioned at a predetermined portion of the pointed element, a resilient element positioned around the axle, and a positioning cap comprising a through channel for fitting onto the axle and pressing against a juncture of the tube, wherein a smaller end of the positioning cap is formed as a positioning portion for positioning the resilient element. The pointed element is elastically slidable within the tube is used for probing.

BRIEF DESCRIPTION OF THE DRAWINGS

For a more complete understanding of the present invention, reference will now be made to the following detailed description of preferred embodiments taken in conjunction with the accompanying drawings, in which.

DESCRIPTION OF THE PREFERRED EMBODIMENTS

Figure 1:
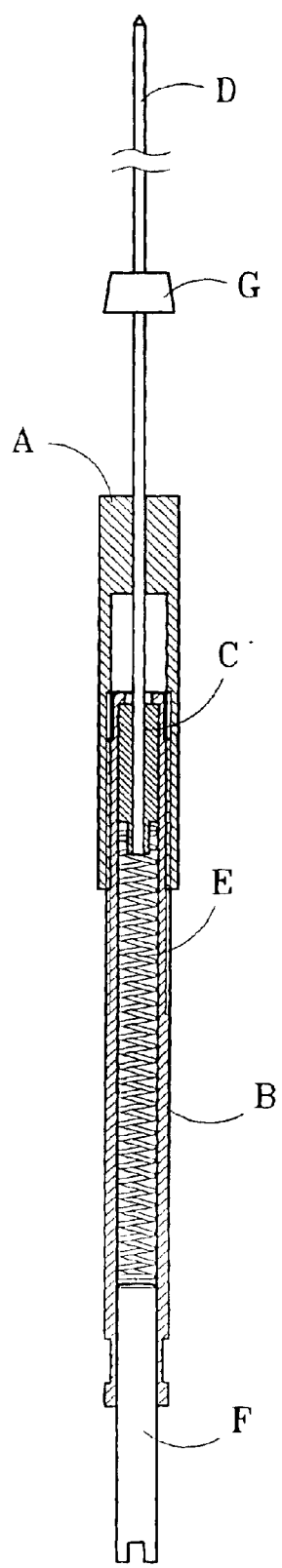
FIG. 1 is a view of a structure of a conventional probe.

Reference will be made in detail to the preferred embodiments of the invention, examples of which are illustrated in the accompanying drawings. Wherever possible, the same reference numbers are used in the drawings and the description to refer to the same or like parts.

Figure 2:
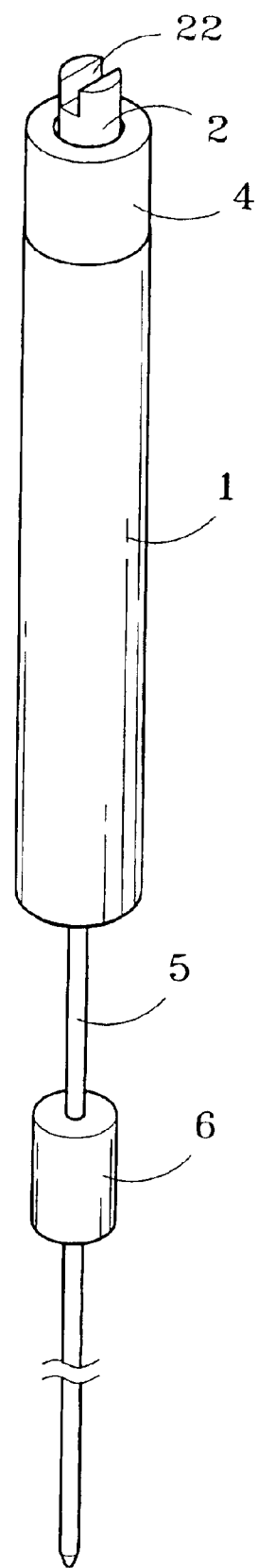
FIG. 2 is a view of a structure of a probe of the present invention.
Figure 3:
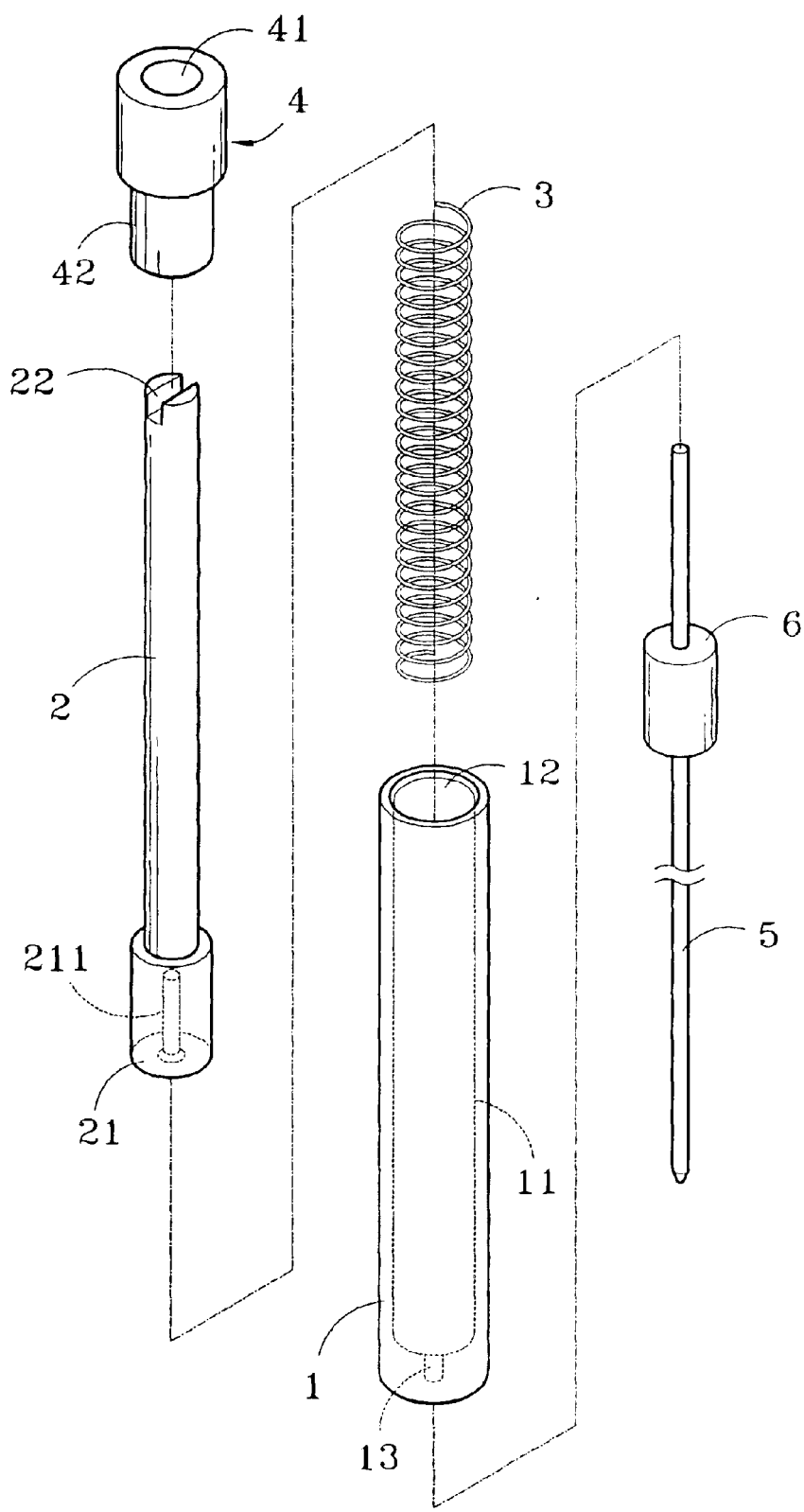
FIG. 3 is an exploded view of the structure of the probe of the present invention.

Referring to FIGS. 2 and 3, the structure of a probe of the present invention comprises a tube 1 enclosing a space 11, a juncture 12 located on a larger end of the tube 1 and a through hole 13 disposed on the smaller end.

An axle 2 having a supporting portion 21 disposed at the larger end, wherein the supporting portion 21 comprises a fitting aperture 211 which is positioned in the space 11, and the supporting portion 21 is positioned against the inner side of the through hole 13. A assembling groove 22 is disposed at the other end of the axle 2.

A pointed element 5 is fixed into the fitting aperture 211 and passes through the through hole 13. A positioning element 6 is positioned at a predetermined portion of the pointed element 5.

A resilient element 3 is positioned around the axle 2 with one end positioned on the supporting portion 21. The resilient element 3 may be comprised of a condensing spring.

A positioning cap 4 comprising a through channel 41 is for fitting onto the axle 2 and presses against the juncture 12, wherein the smaller end of the positioning cap is formed as a positioning portion 42 for positioning the resilient element 3 within the tube 1.

The pointed element 5 is elastically slidable within the tube 1 by a resilient element 3.

Figure 4:
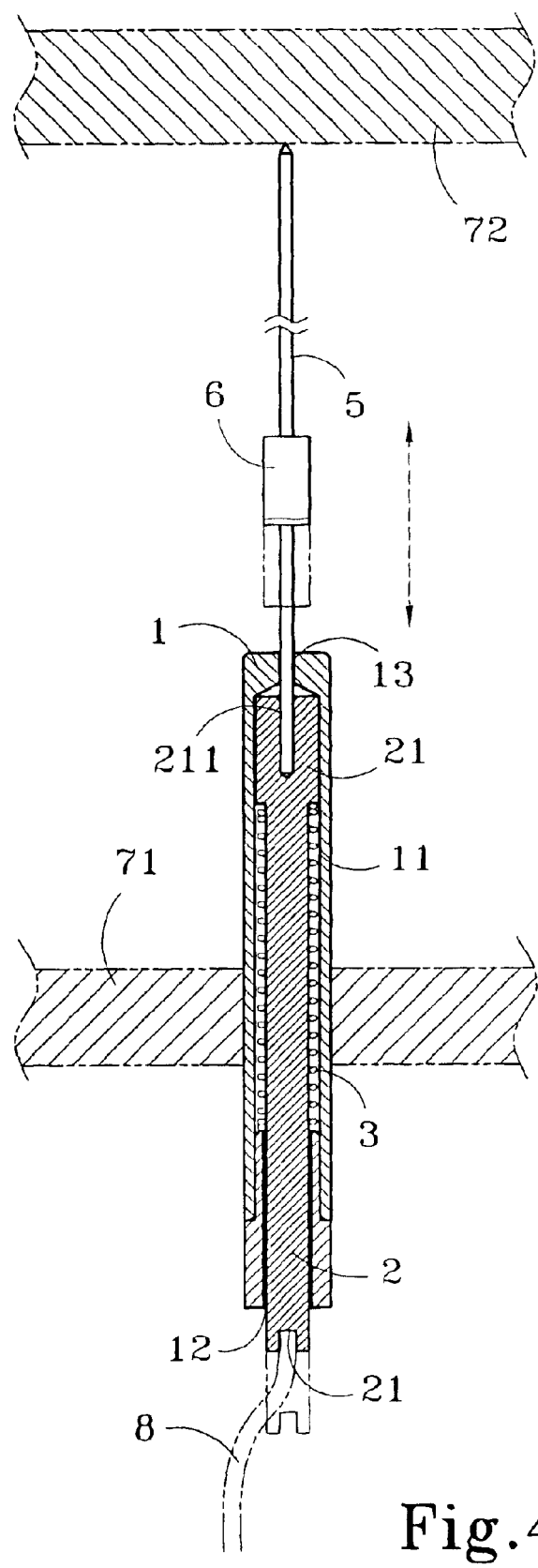
FIG. 4 is a view of an embodiment showing the probing motion according to the present invention.

Referring to FIG. 4, the cover tube of the probe of the present invention is fixed on a vacuum suction fixture 7, wherein the fixture 7 comprises a set of suction tube (not shown) assembled to the base 71 for creating vacuum within the fixture 7. By using an air pressure an upper lid 72 is pressed down for contacting and pressing the pointed element 5 downwardly. Meanwhile the positioning element 6 limits the extent of the compression of the pointed element 5. A wire 8 is set at a distal end of the axle 2 for transmitting data to the computer (not shown) for executing the test work. After the test work is completed, the air will inflate into the fixture 7, the upper lid 72 will rise upwardly, and the pointed element 5 will return back to its original position due the elasticity of the resilient element 3.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A structure of a probe, comprising:

a tube, enclosing a space, comprising a juncture positioned on a larger end of said tube and a through hole positioned on a smaller end;

an axle, comprising a supporting portion is set at the larger end and is positioned within the space, and said supporting portion is positioned against an inner side of the through hole;

a pointed element, fixed on said axle is positioned into said through hole;

a resilient element, positioned around said axle, wherein one end of the resilient element is positioned against said supporting portion;

a positioning cap, comprising a hollow through channel, and said through channel is for fitting through said axle and for pressing against a juncture of the tube, wherein a smaller end of said positioning cap is formed as a positioning portion for positioning said resilient element within the tube such that said pointed element can elastically slide within said tube.

2. The structure of a probe according to claim 1, wherein said axle comprises a fitting aperture disposed at said supporting portion.

3. The structure of a probe according to claim 1, wherein an assembling groove is disposed at another end of said axle.

4. The structure of a probe according to claim 1, wherein said resilient element is comprised of a condensing spring.

5. The structure of a probe according to claim 1, wherein said pointed element comprises a positioning element at a predetermined position to limit an extent of compression of the pointed element.

* * * * *